(12) United States Patent
Zang et al.

(10) Patent No.: US 9,799,514 B1
(45) Date of Patent: Oct. 24, 2017

(54) PROTECTING, OXIDIZING, AND ETCHING OF MATERIAL LINES FOR USE IN INCREASING OR DECREASING CRITICAL DIMENSIONS OF HARD MASK LINES

(71) Applicant: GLOBALFOUNDRIES Inc., Grand Cayman (KY)

(72) Inventors: Hui Zang, Guilderland, NY (US); Min-hwa Chi, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/093,292

(22) Filed: Apr. 7, 2016

(51) Int. Cl.
*H01L 21/22* (2006.01)
*H01L 21/033* (2006.01)
*H01L 21/8234* (2006.01)
*H01L 21/02* (2006.01)
*H01L 21/311* (2006.01)

(52) U.S. Cl.
CPC .... *H01L 21/0337* (2013.01); *H01L 21/02238* (2013.01); *H01L 21/0332* (2013.01); *H01L 21/31105* (2013.01); *H01L 21/823431* (2013.01); *H01L 21/823456* (2013.01); *H01L 21/823475* (2013.01)

(58) Field of Classification Search
CPC ............... H01L 21/3114; H01L 21/308; H01L 21/0337; H01L 21/02238; H01L 21/0332; H01L 21/31105; H01L 21/823456; H01L 21/823475
See application file for complete search history.

(56) References Cited

U.S. PATENT DOCUMENTS

| 8,513,131 | B2 | 8/2013 | Cai et al. |
| 9,455,347 | B1 | 9/2016 | Leobandung |
| 9,502,231 | B2 | 11/2016 | Liu et al. |
| 2011/0147811 | A1 | 6/2011 | Kavalieros et al. |
| 2012/0313170 | A1 | 12/2012 | Chang et al. |
| 2013/0299875 | A1 | 11/2013 | Hong |

(Continued)

OTHER PUBLICATIONS

Lapeyre, C., et al., "Cost Effective SADP based on Spin on Carbon," Proc. Int. Symp. on Lithography Extensions, Oct. 20-22, 2010, pp. 1-25. Oct. 22, 2010.

(Continued)

*Primary Examiner* — Seahvosh Nikmanesh
(74) *Attorney, Agent, or Firm* — Heslin Rothenberg Farley and Mesiti PC

(57) ABSTRACT

A method includes, for example, a starting semiconductor structure comprising a plurality of material lines disposed over a hard mask, and the hard mask disposed over a patternable layer, forming a first protective layer over some of the plurality of material lines, the protected material lines and the unprotected material lines having a same corresponding first critical dimension, oxidizing the unprotected material lines so that the oxidized unprotected material lines have an increased second critical dimension greater than the first critical dimension, removing the first protective layer, forming a second protective layer over some of the plurality of protected material lines having the first critical dimension and some of the oxidized material lines having the second critical dimension, and oxidizing the unprotected material lines so that the oxidized unprotected material lines have an increased third critical dimension greater than the first critical dimension.

15 Claims, 11 Drawing Sheets

(56) References Cited

U.S. PATENT DOCUMENTS

2014/0217508 A1   8/2014   Chang et al.
2015/0021690 A1   1/2015   Jacob et al.
2015/0064912 A1   3/2015   Jang et al.
2016/0020109 A1   1/2016   Yoo
2016/0064224 A1   3/2016   Hung et al.
2016/0163555 A1   6/2016   Jang et al.
2016/0240629 A1   8/2016   Liou et al.
2016/0293443 A1   10/2016  Ban et al.

OTHER PUBLICATIONS

Hui et al., U.S. Appl. No. 15/093,310, filed Apr. 7, 2016, entitled "Oxidizing, and Etching of Material Lines for Use in Increasing or Decreasing Critical Dimensions of Hard Mask Lines". Apr. 7, 2016.
Peddeti, U.S. Appl. No. 15/093,272, filed Apr. 7, 2016, entitled "Integration of Nominal Gate Width 7 Finfets and Devices Having Larger Gate Width" Apr. 7, 2016.
Peddeti et al., U.S. Appl. No. 15/093,212, filed Apr. 7, 2016, entitled "Oxidizing Filler Material Lines to Increase Width of Hard Mask Lines" Apr. 7, 2016.
Peddeti, U.S. Appl. No. 15/093,272, First Office Action dated Jan. 23, 2017, 19 pages.
Peddeti, U.S. Appl. No. 15/093,272, Final Office Action dated Apr. 26, 2017, 16 pages.

9,799,514 B1

PROTECTING, OXIDIZING, AND ETCHING OF MATERIAL LINES FOR USE IN INCREASING OR DECREASING CRITICAL DIMENSIONS OF HARD MASK LINES

TECHNICAL FIELD

The present disclosure generally relates to semiconductor fabrication, and more particularly, to method for use in semiconductor fabrication, for example, protecting, oxidizing, and etching of material lines for use in increasing or decreasing corresponding critical dimensions of hard mask lines.

BACKGROUND OF THE DISCLOSURE

With CMOS technology entering FinFET in 14 nanometers (nm), conventional lithography is no longer capable for patterning fine pitches. The self-align-dual-patterning (SADP), self-aligned quadruple patterning (SAQP), or sidewall image transfer (SIT) process enables the small pitch patterning in forming Fins, gates, or even in BEOL (Back-End-Of-The-Line) metal connections at 7 nanometers node and beyond. Spacer defined lithography (SIT) only offers one CD (critical dimension) such as widths for fine lines.

SUMMARY OF THE DISCLOSURE

Shortcomings of the prior art are overcome and additional advantages are provided through the provision, in one embodiment, of a method which includes, for example, providing a starting semiconductor structure having a plurality of material lines disposed over a hard mask, and the hard mask disposed over a patternable layer, forming a first protective layer over some of the plurality of material lines, the protected material lines and the unprotected material lines having a same corresponding first critical dimension, oxidizing the unprotected material lines so that the oxidized unprotected material lines have an increased second critical dimension greater than the first critical dimension, removing the first protective layer, forming a second protective layer over some of the plurality of protected material lines having the first critical dimension and some of the oxidized material lines having the second critical dimension, and oxidizing the unprotected material lines so that the oxidized unprotected material lines have an increased third critical dimension greater than the first critical dimension.

In another embodiment, a method is provided. The method includes, for example, providing a starting semiconductor structure having a plurality of material lines disposed over a hard mask, and the hard mask disposed over a patternable layer, forming a first protective layer over some of the plurality of material lines, the protected material lines and the unprotected material lines having a same corresponding first critical dimension, oxidizing the unprotected material lines so that the oxidized unprotected material lines have an increased second critical dimension greater than the first critical dimension, removing the first protective layer, forming a second protective layer over some of the plurality of protected material lines having the first critical dimension and some of the oxidized material lines having the second critical dimension, oxidizing the unprotected material lines so that the oxidized unprotected material lines have an increased third critical dimension greater than the first critical dimension, etching at least a portion of the first oxidized unprotected material lines so that the unprotected first oxidized material lines have a forth critical dimension less than the second critical dimension, and etching at least a portion of the second oxidized unprotected material lines so that the unprotected second oxidized material lines have a fifth critical dimension less than the third critical dimension.

In another embodiment, an intermediate semiconductor structure is provided. The intermediate semiconductor structure includes, for example, a first plurality of material lines, a second plurality of material lines, and a third plurality of material lines disposed over a hard mask, the hard mask disposed over a patternable layer, and the patternable layer disposed over a bulk semiconductor substrate. The second plurality of material lines includes etched oxide or having oxide removed. The third plurality of material lines includes etched oxide or having oxide removed. The first plurality of material lines have a first critical dimension, the second plurality of material lines have a corresponding second critical dimension, and the third plurality of material lines have a corresponding third critical dimension. The first critical dimension, the second critical dimension, and the third critical dimension being different.

Additional features and advantages are realized through the techniques of the present disclosure. Other embodiments and aspects of the present disclosure are described in detail herein and are considered a part of the claims.

BRIEF DESCRIPTION OF THE DRAWINGS

The subject matter of the present disclosure is particularly pointed out and distinctly claimed in the concluding portion of the specification. The disclosure, however, may best be understood by reference to the following detailed description of various embodiments and the accompanying drawings in which:

DETAILED DESCRIPTION OF THE DISCLOSURE

Aspects of the present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the disclosure in detail. It should be understood, however, that the detailed description and the specific examples, while indicating embodiments of the present disclosure, are given by way of illustration only, and are not by way of limitation. Various substitutions, modifications, additions and/or arrangements within the spirit and/or scope of the underlying concepts will be apparent to those skilled in the art from this disclosure. Reference is made below to the drawings, which are not drawn to scale for ease of understanding, wherein the same reference numbers used throughout different figures designate the same or similar components.

The present disclosure is directed to self-align-dual-patterning (SADP), sidewall image transfer (SIT), and self-aligned quadruple patterning (SAQP) processes with selective multi-CD (critical dimension) patterning capability by selectively fine tuning the spacer CD using a combination of oxidation or partial oxidation and wet/dry oxide etching or partial wet/dry oxide etching. The present disclosure may be advantageous for fine tuning CD of multi-fin fin widths or multi-channel lengths (for multi-Vt scheme), multi-gate widths or multi-gate channel lengths (for SOC), and/or BEOL metal connections with minimum extra masking steps without selectively performing an entire SADP or SAQP process.

Figure 1:
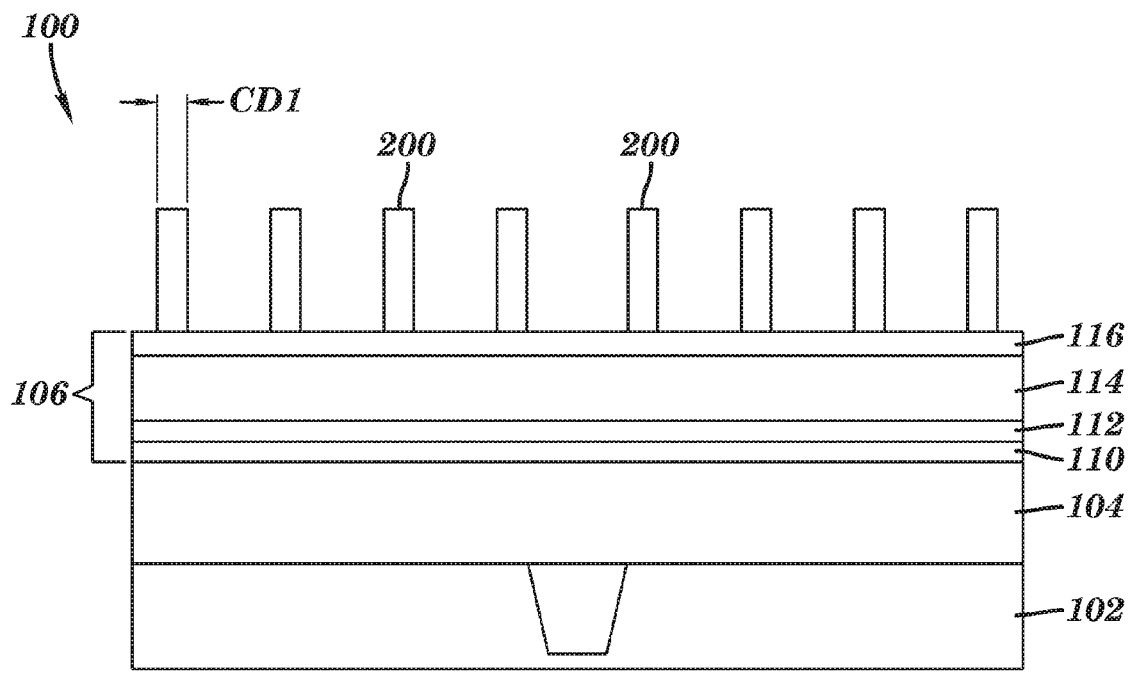
FIG. 1 is a cross-sectional view of a starting semiconductor structure according to an embodiment of the present disclosure.

FIG. 1 illustrates a cross-sectional view of a starting semiconductor structure 100 having a bulk semiconductor substrate 102 such as silicon, a patternable layer 104 such as polysilicon above the semiconductor substrate, a hard mask layer 106 over the patternable layer and a plurality of material lines 200 such as amorphous silicon or polysilicon over the hard mask layers according to an embodiment of the present disclosure. For example, hard mask layer 106 may include a stack of a silicon nitride layer 110, an oxide layer 112, a silicon nitride layer 114, and a low-k dielectric layer 116.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlinAs, GalnAs, GaInP, or GaInAsP or combinations thereof.

Starting semiconductor structure 100 may be conventionally fabricated, for example, using known processes and techniques. An initial structure may include of bulk semiconductor substrate 102, patternable layer 104, and a hard mask layer 106, and subjected to a self-align-dual-patterning (SADP) or self-aligned quadruple patterning (SAQP) process. For example, an oxide or amorphous carbon layer may be deposited on hard mask layer 106. The oxide or amorphous carbon layer may then patterned and operably etched to form patterned mandrels. A layer of amorphous silicon or polysilicon may be deposed over the patterned mandrels, and an etching process employed to form vertical spacers on mandrel. Removal or stripping back the mandrel results in the spacers forming the plurality of material lines 200 shown in FIG. 1. For example, material lines 200 may be disposed at the same pitch and may have a similar critical dimension CD1.

FIGS. 2-10 illustrate a process for use in semiconductor fabrication having a multiplicity of different corresponding critical dimensions according to an embodiment of the present disclosure. For example, a critical dimension of initially fabricated material lines may be increased and/or reduced resulting in a multiplicity of differently sized corresponding critical dimensions.

Figure 2:
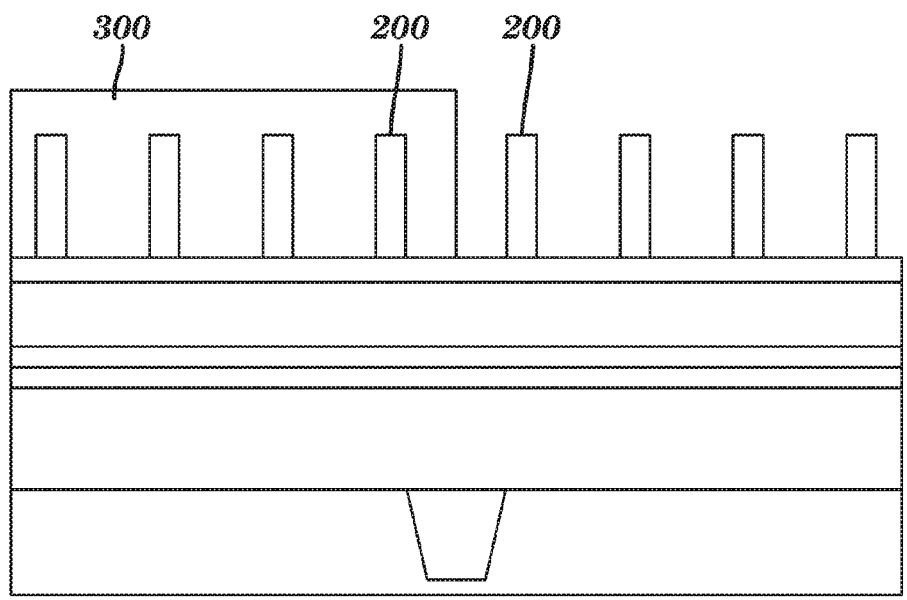
FIGS. 2-10 are cross-sectional views of a method for forming intermediate semiconductor structures having a hard mask lines having different corresponding critical dimensions according to an embodiment of the present disclosure.

Initially, as shown in FIG. 2, a first patterned protective layer 300 is disposed over one or more of material lines 200. For example, the first patterned protective layer may be disposed over the material lines having a same corresponding critical dimension. Patterned protective layer 300 may be formed using a lithographic and masking process.

Figure 3:
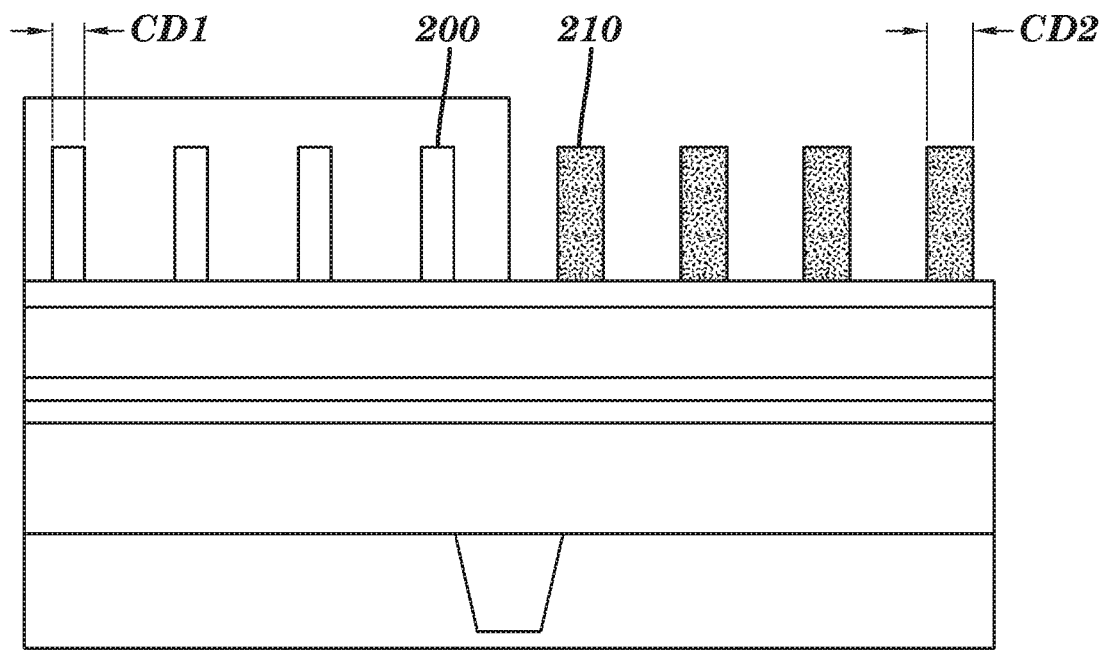

With reference to FIG. 3, a first oxidation process such as at a low temperature is performed on the structure of FIG. 2 so that the unprotected material lines 200 (FIG. 2) may be fully oxidized. Due to the oxidation process, the fully oxidized unprotected material line 210 have a corresponding critical dimension CD2 greater than a critical dimension CD1 (FIGS. 1 and 3) of protected material lines 200. Critical dimension CD2 may be up to about 40 percent greater, e.g., Si being fully oxidized to SiO2.

Figure 4:
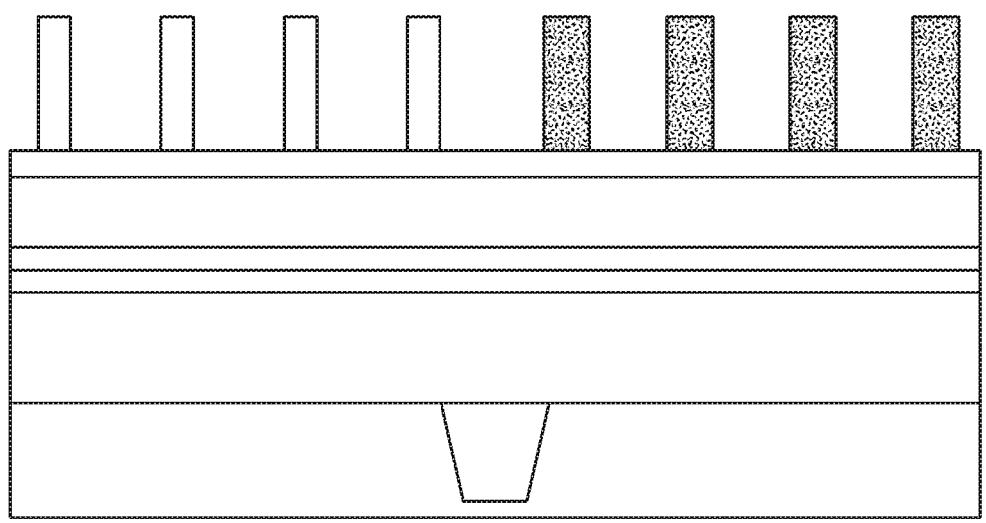

Patterned protective layer 300 is removed as shown in FIG. 4 resulting in the material lines having different corresponding size critical dimensions. For example, the patterned protective layer may be removed by a wet or plasma N2/H2 ashing (non-oxidizing) process.

Figure 5:
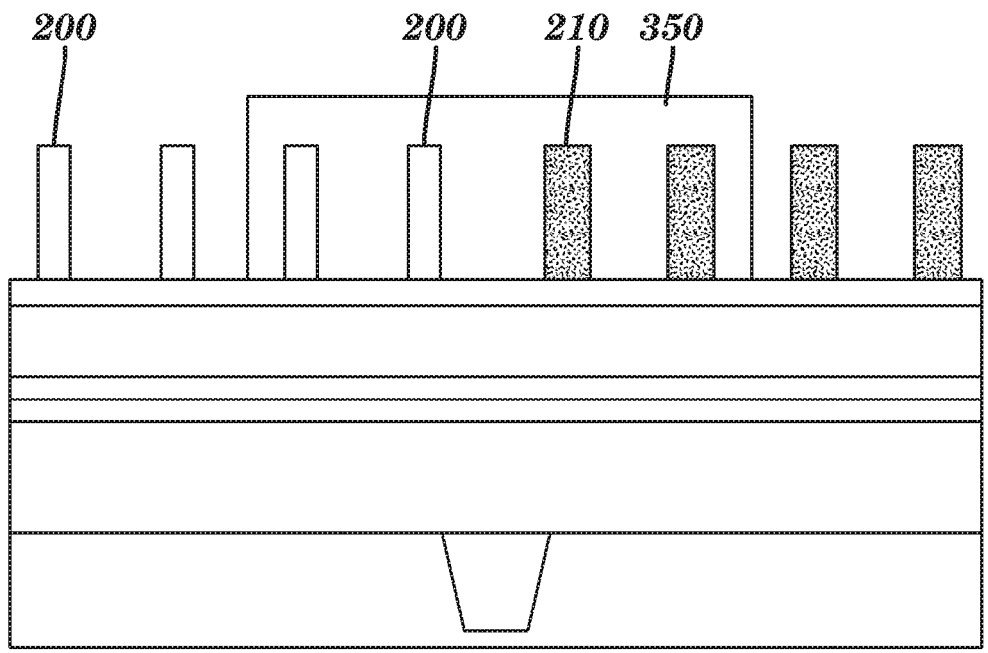

As shown in FIG. 5, a second patterned protective layer 350 is disposed over one or more of material lines 200 and one or more of material lines 210. For example, the second patterned protective layer may be disposed over the material lines having different corresponding critical dimensions. Patterned protective layer 350 may be formed using a lithographic and masking process.

Figure 6:
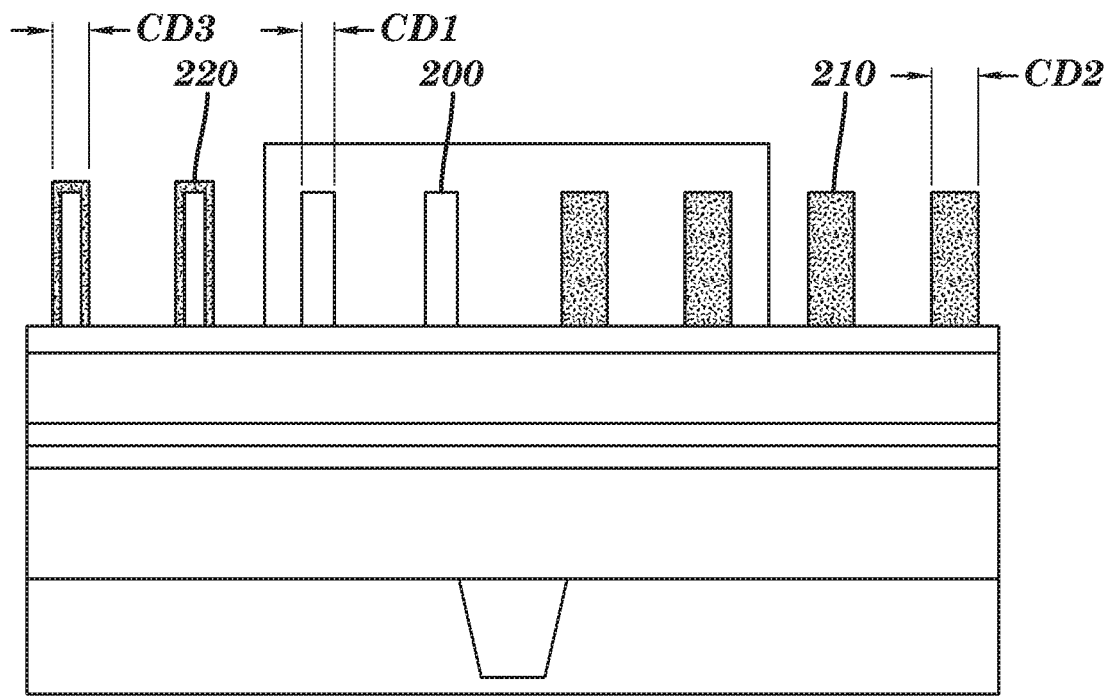

With reference to FIG. 6, a second oxidation process such as at a low temperature is performed on the structure of FIG. 5 so that unprotected material lines 200 (FIG. 5) may be partially oxidized. Due to the oxidation process, the partially oxidized unprotected material lines 220 have a corresponding critical dimension CD3 greater than a critical dimension CD1 (FIGS. 1 and 6) of protected material lines 200. The oxidation process will not affect fully oxidized material lines 210. Thus, the structure shown in FIG. 6 include the material lines having three different corresponding critical dimensions, namely, CD1, CD2, and CD3. For example, CD3 may be less than CD2, and CD1 may be less than CD3.

Figure 7:
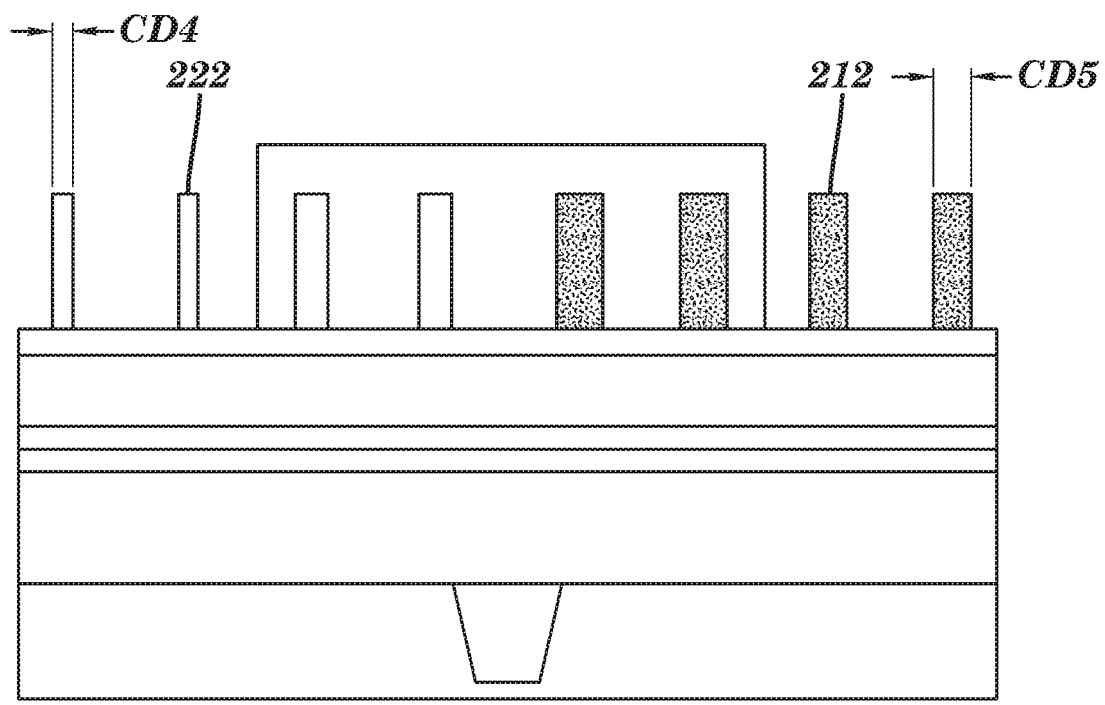

An etching process is performed on the structure of FIG. 6 to remove oxide portions (e.g., a fixed amount) as shown in FIG. 7. The oxide etching may be a wet oxide etching or a dry oxide etching. For example, a wet oxide etching may be employed using, e.g., a HF acid. A dry oxide etching may include a SiCoNi etch. The etching process may result in the (full or partial) removal of the oxide material on material lines 220 (FIG. 6) and a reduction in the oxide material of material lines 210 (FIG. 6). Due to the etching process, material lines 222 may have a critical dimension CD4, and material lines 212 may have a critical dimension CD5.

Figure 8:
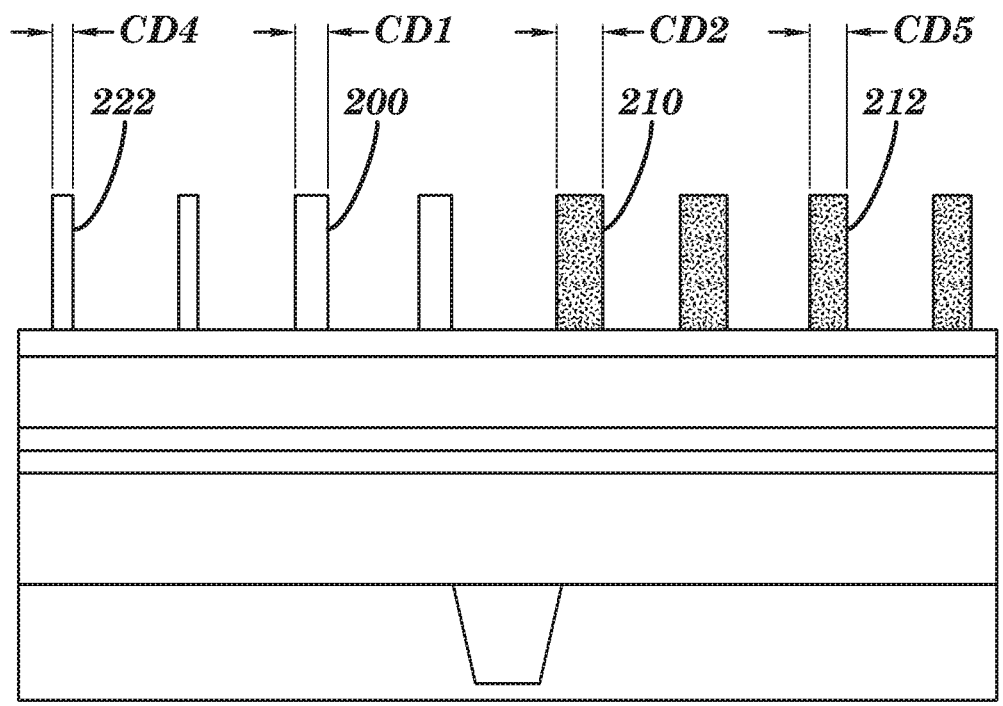
Figure 9:
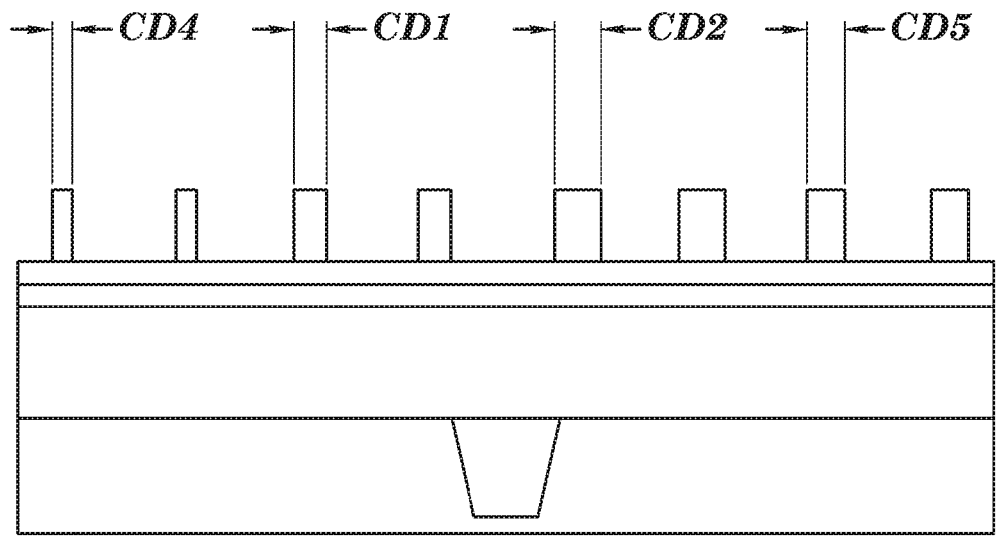
Figure 10:
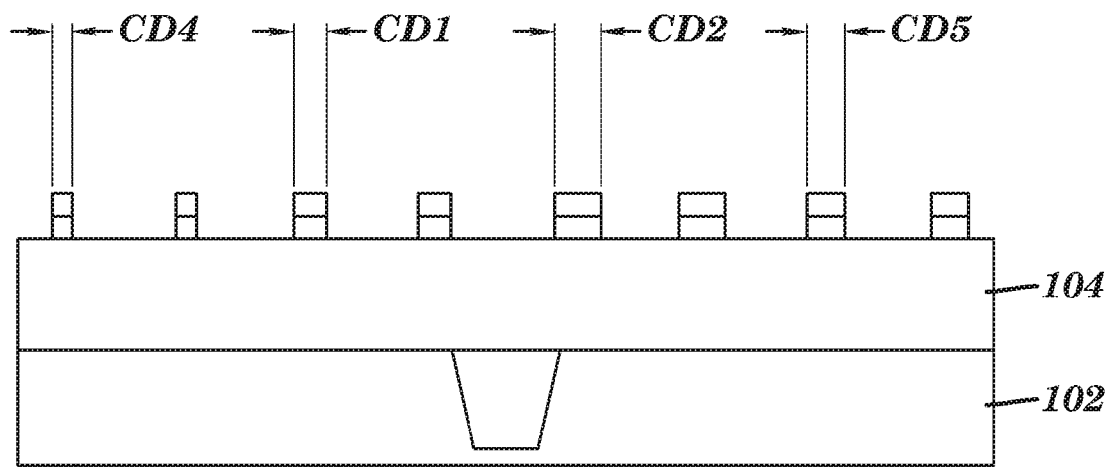

The patterned protective layer 350 is removed as shown in FIG. 8 resulting in the material lines having multiple different corresponding size critical dimensions. For example, the patterned protective layer may be removed by a wet or plasma N2/H2 ashing (non-oxidizing) process.

Thus, the structure shown in FIG. 8 includes the material lines having four different corresponding critical dimensions, namely, material lines 200 having a critical dimension CD1, material lines 210 having a critical dimension CD2, material lines 222 having a critical dimension CD4 and material lines 212 having a critical dimension CD5. In this illustrated example, CD2 may be greater than CD5, CD5 may be greater than CD1, and CD1 may be greater than CD4. Critical dimensions CD1, CD2, CD4, and CD5 may be about 3 nanometers to about 18 nanometers. Critical dimensions CD1, CD2, CD4, and CD5 may be less that about 10 nanometers.

The different corresponding sized critical dimensions of the material lines are used for pattern transfer to the underlying layers. An etching process is employed on the resulting structure of FIG. 8 resulting in patterning of hard masks shown in FIGS. 9 and 10. After removal of the first hard mask (FIG. 9), resulting final patterned hard masks (FIG. 10) may be used for patterning the patternable layer 104 and also the bulk semiconductor substrate 102 for forming multiple fins having different critical dimensions, e.g., widths or lengths (where the substrate is silicon). If the underlying layer is amorphous silicon (as dummy gate) and to be patterned with different critical dimensions, e.g., widths or lengths, then a similar method can be performed.

Figure 11:
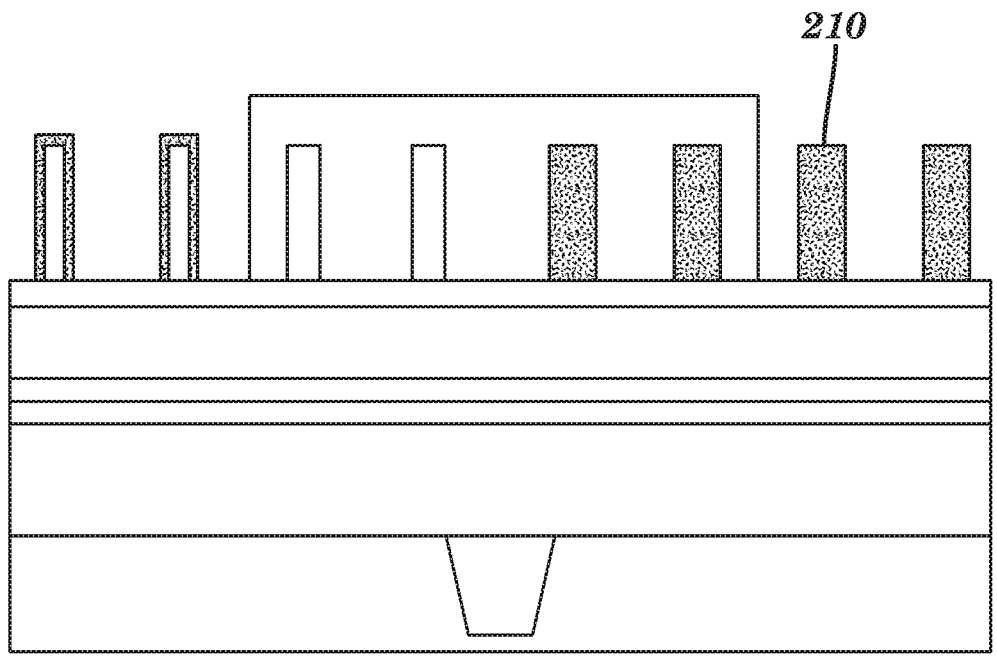
FIGS. 11 and 12 are cross-sectional views of a method for forming intermediate semiconductor structures for use in forming hard mask lines having different corresponding critical dimensions according to an embodiment of the present disclosure.
Figure 12:
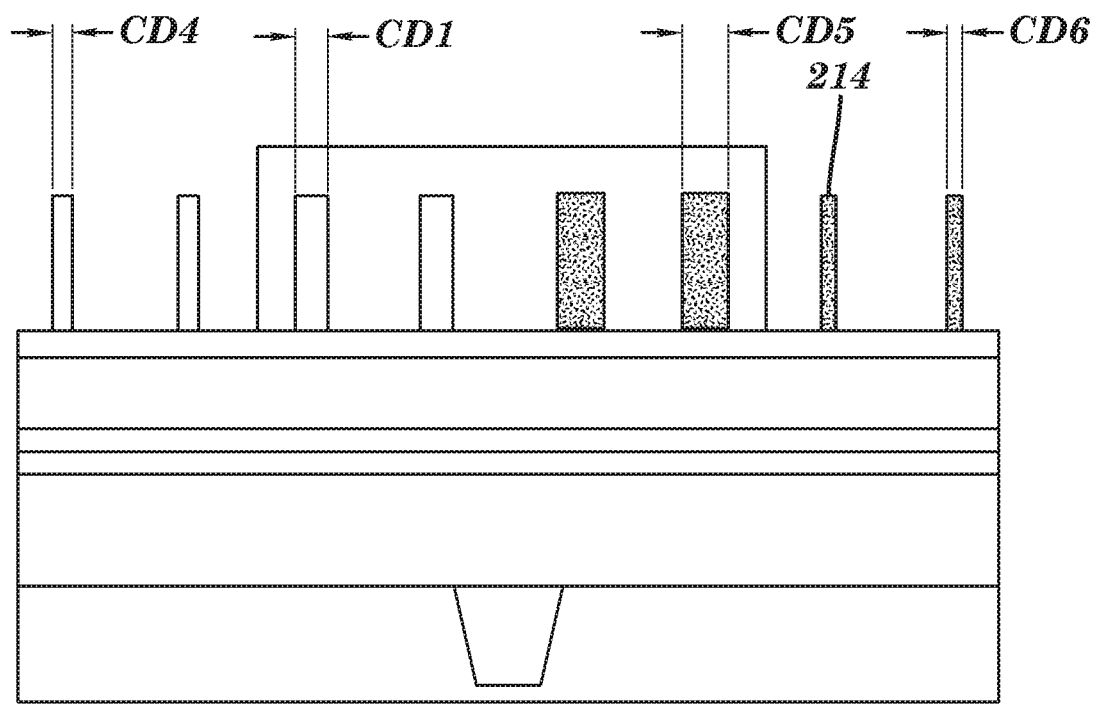

FIGS. 11 and 12 illustrate a process for use in semiconductor fabrication having a multiplicity of different corresponding critical dimensions according to an embodiment of the present disclosure. For example, a critical dimension of initially fabricated material lines may be increased and/or reduced resulting in a multiplicity of differently sized corresponding critical dimensions.

Initially, FIG. 11 is essentially the same as FIG. 6. An etching process is performed on the structure of FIG. 11 to remove oxide portions as shown in FIG. 12. The oxide etching may be a wet oxide etching or a dry oxide etching. For example, a wet oxide etching may be employed using, e.g., a HF acid. A dry oxide etching may include a SiCoNi etch.

In this embodiment, the etching process may result in the removal of the oxide material on material lines 210 (FIG. 11) to such as extent that the resulting a critical dimension CD6 which is less than critical dimensions CD1, CD 4, and CD5. Critical dimension CD6 may be about 3 nanometers to about 18 nanometers. Critical dimensions CD6 may be less that about 10 nanometers.

FIGS. 13-17 illustrate a process for use in semiconductor fabrication having a multiplicity of different corresponding critical dimensions according to an embodiment of the present disclosure. For example, a critical dimension of initially fabricated material lines may be increased and/or reduced resulting in a multiplicity of differently sized corresponding critical dimensions.

Figure 13:
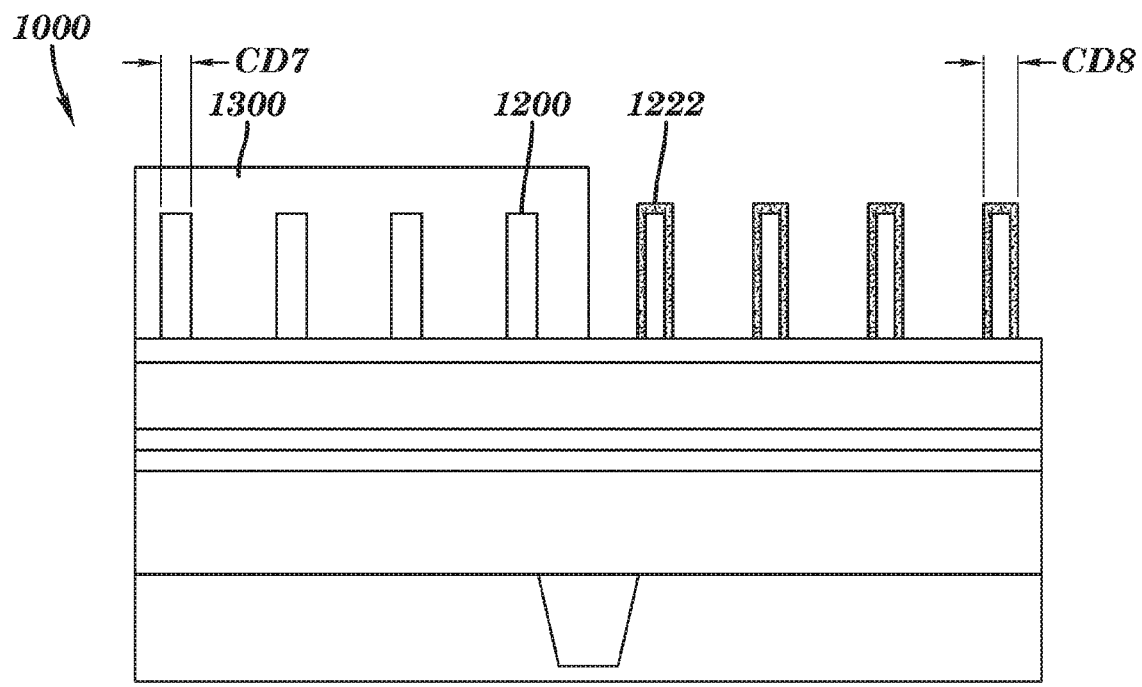
FIGS. 13-17 are cross-sectional views of a method for forming intermediate semiconductor structures for use in forming hard mask lines having different corresponding critical dimensions according to an embodiment of the present disclosure.

Initially, as shown in FIG. 13, a starting semiconductor structure 1000 may be similar to starting semiconductor structure 100 (FIG. 1). For example, the starting semiconductor structure may include a bulk semiconductor substrate such as silicon, a first material layer such as polysilicon above the semiconductor substrate, a hard mask layers over the first material layer and a plurality of material lines 1200 such as amorphous silicon or polysilicon over the hard mask layers according to an embodiment of the present disclosure. A patterned protective layer 1300 is disposed over one or more of the material lines 1200 (with other material lines (not shown in FIG. 13 not being covered). For example, patterned protective layer 1300 may be formed using a lithographic and masking process.

An oxidation process such as at a low temperature is performed on the structure of FIG. 13 (and uncovered material lines not shown in FIG. 13) so that the unprotected material lines are partially oxidized. Due to the oxidation process, the partially oxidized unprotected material lines 1222 have a critical dimension CD8 which is greater than a critical dimension CD7 of the protected material lines 1200. Patterned protective layer 1300 is then removed, for example, by a wet or plasma N2/H2 ashing (non-oxidizing) process.

Figure 14:
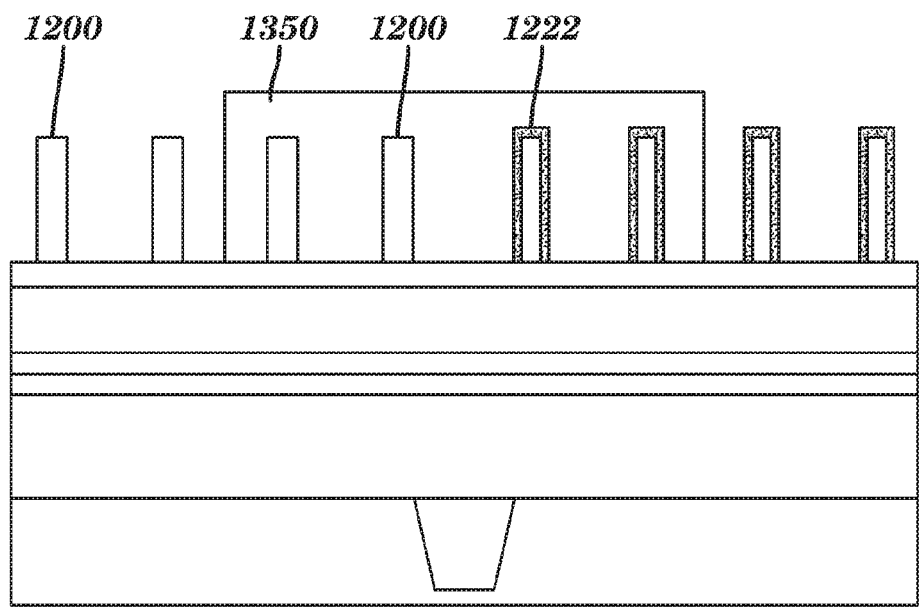

As shown in FIG. 14, a second patterned protective layer 1350 is disposed over one or more of material lines 1200 and one or more of material lines 1222. For example, the second patterned protective layer may be disposed over the material lines having different corresponding critical dimensions. Patterned protective layer 1350 may be formed using a lithographic and masking process.

Figure 15:
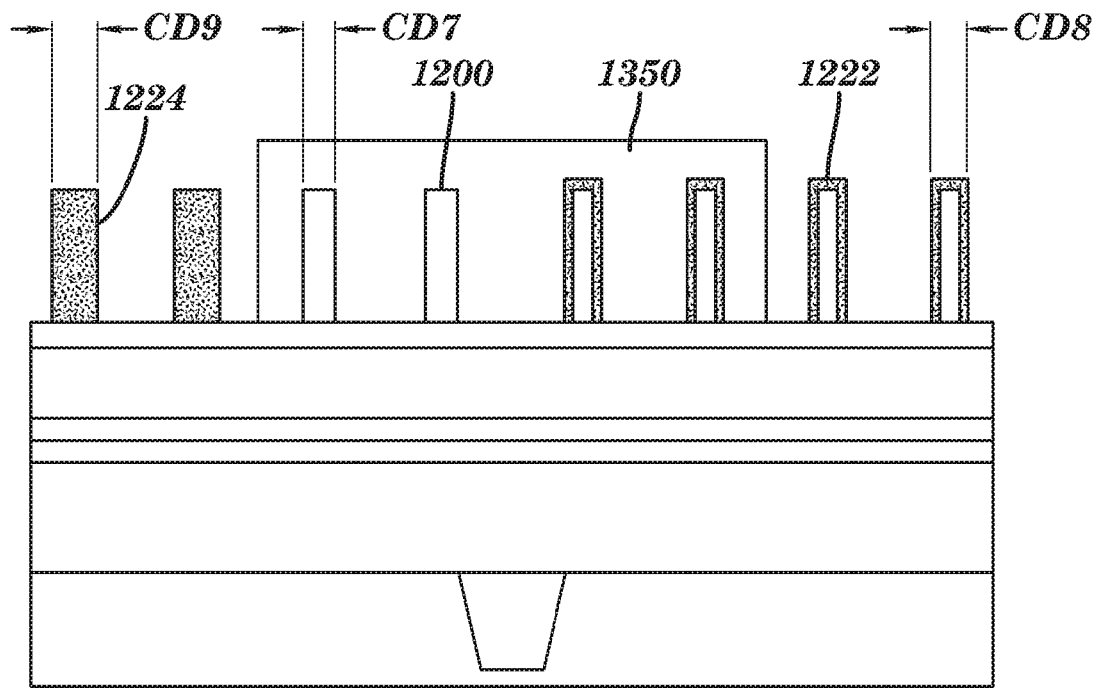

With reference to FIG. 15, a second oxidation process such as at a low temperature is performed on the structure of FIG. 15 so that unprotected material lines 1200 (FIG. 14) may be fully oxidized. Due to the oxidation process, the fully oxidized unprotected material lines 1224 have a corresponding critical dimension CD9 greater than a critical dimension CD7 (FIG. 13). Critical dimension CD9 may be up to about 40 percent greater, e.g., Si being fully oxidized to SiO2. The oxidation process will only slightly further oxidize the partially oxidized material lines 1222. Thus, the structure shown in FIG. 15 include the material lines having three different corresponding critical dimensions, namely, CD7, CD8, and CD9. For example, CD7 may be less than CD8, and CD7 may be less than CD9.

Figure 16:
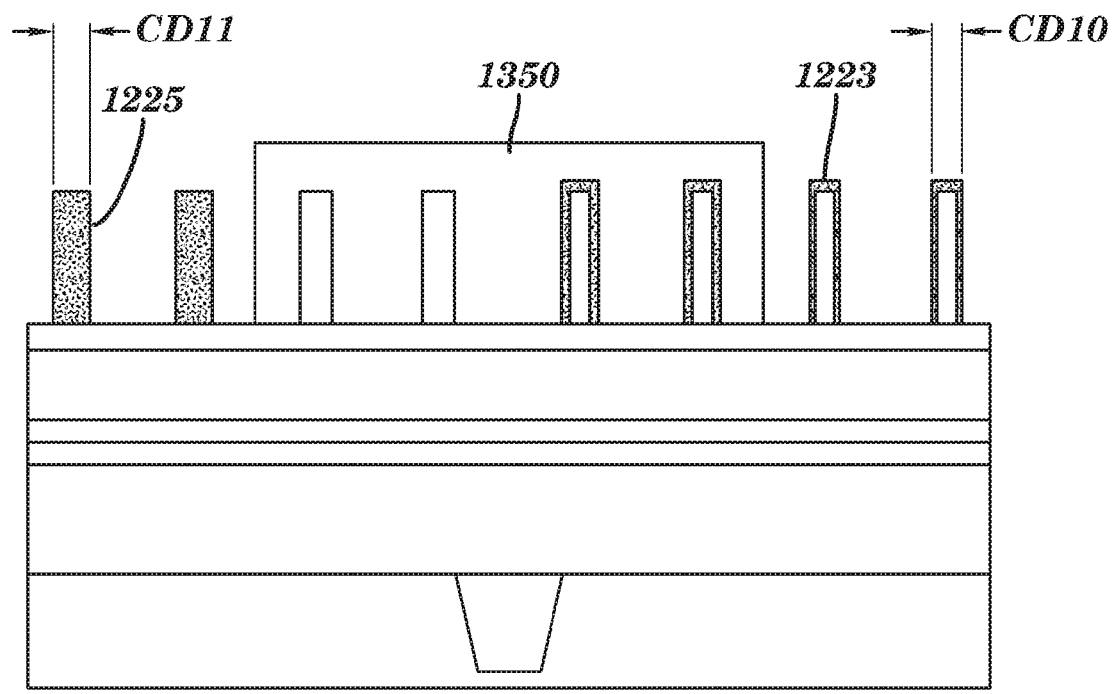

An etching process is performed on the structure of FIG. 15 to remove oxide portions (e.g., a fixed amount) as shown in FIG. 16. The oxide etching may be a wet oxide etching or a dry oxide etching. For example, a wet oxide etching may be employed using, e.g., a HF acid. A dry oxide etching may include a SiCoNi etch. The etching process may result in a partial removal of the oxide material on material lines 1222 (FIG. 15) and a reduction (full or partial removal) in the oxide material of material lines 1224 (FIG. 15). Due to the etching process, material lines 1223 may have a critical dimension CD10, and material lines 1225 may have a critical dimension CD11.

Figure 17:
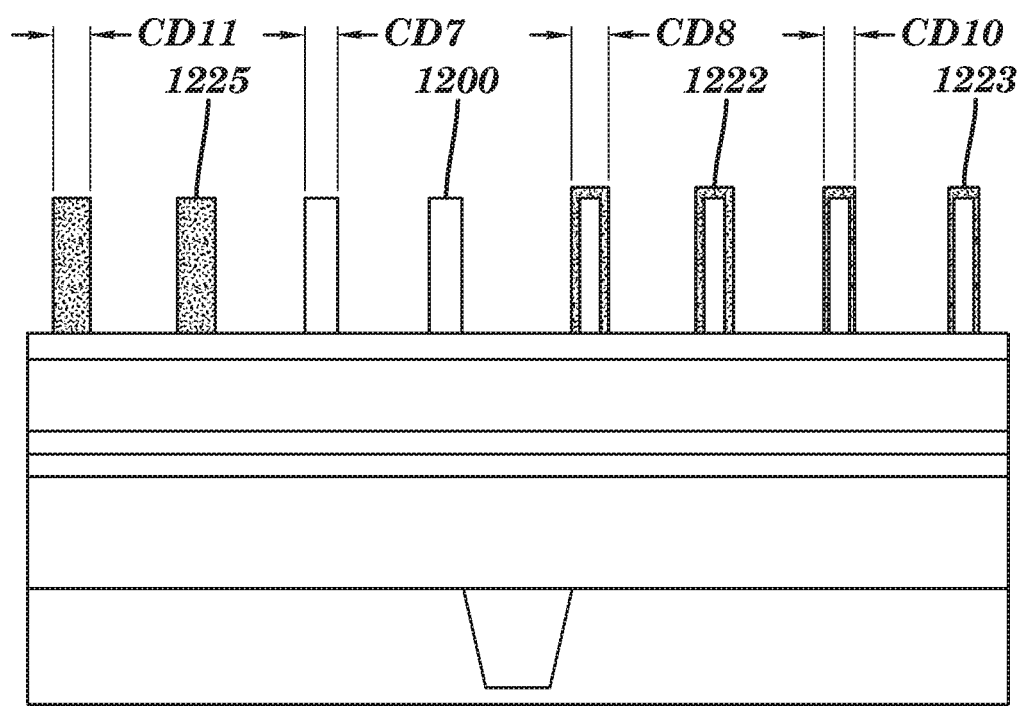

The patterned protective layer 1350 may be removed, as shown in FIG. 17, resulting in material lines having multiple different corresponding size critical dimensions. For example, the patterned protective layer may be removed by a wet or plasma N2/H2 ashing (non-oxidizing) process. Thus, the resulting structure includes the material lines having four different corresponding critical dimensions, namely, material lines 1200 having a critical dimension CD7, material lines 1222 having a critical dimension CD8, material lines 1223 having a critical dimension CD10, and material lines 1225 having a critical dimension CD11. In this illustrated example, CD11 may be greater than CD8, CD8 may be greater than CD10, and CD10 may be greater than CD7. Critical dimensions CD7, CD8, CD10, and CD11 may be about 3 nanometers to about 18 nanometers. Critical dimensions CD7, CD8, CD10, and CD11 may be less that about 10 nanometers.

The different corresponding sized critical dimensions of the material lines are used for pattern transfer to the underlying layers. An etching process is employed on the resulting structure of FIG. 16 resulting in patterning of hard masks (similar to shown in FIGS. 9 and 10). After removal of the first hard mask, resulting final patterned hard masks may be used for patterning the patternable layer and also the bulk semiconductor substrate for forming multiple fins having different critical dimensions, e.g., widths or lengths (where the substrate is silicon). If the underlying layer is amorphous silicon (as dummy gate) and to be patterned with different critical dimensions, e.g., widths or lengths, then a similar method can be performed.

Figure 18:
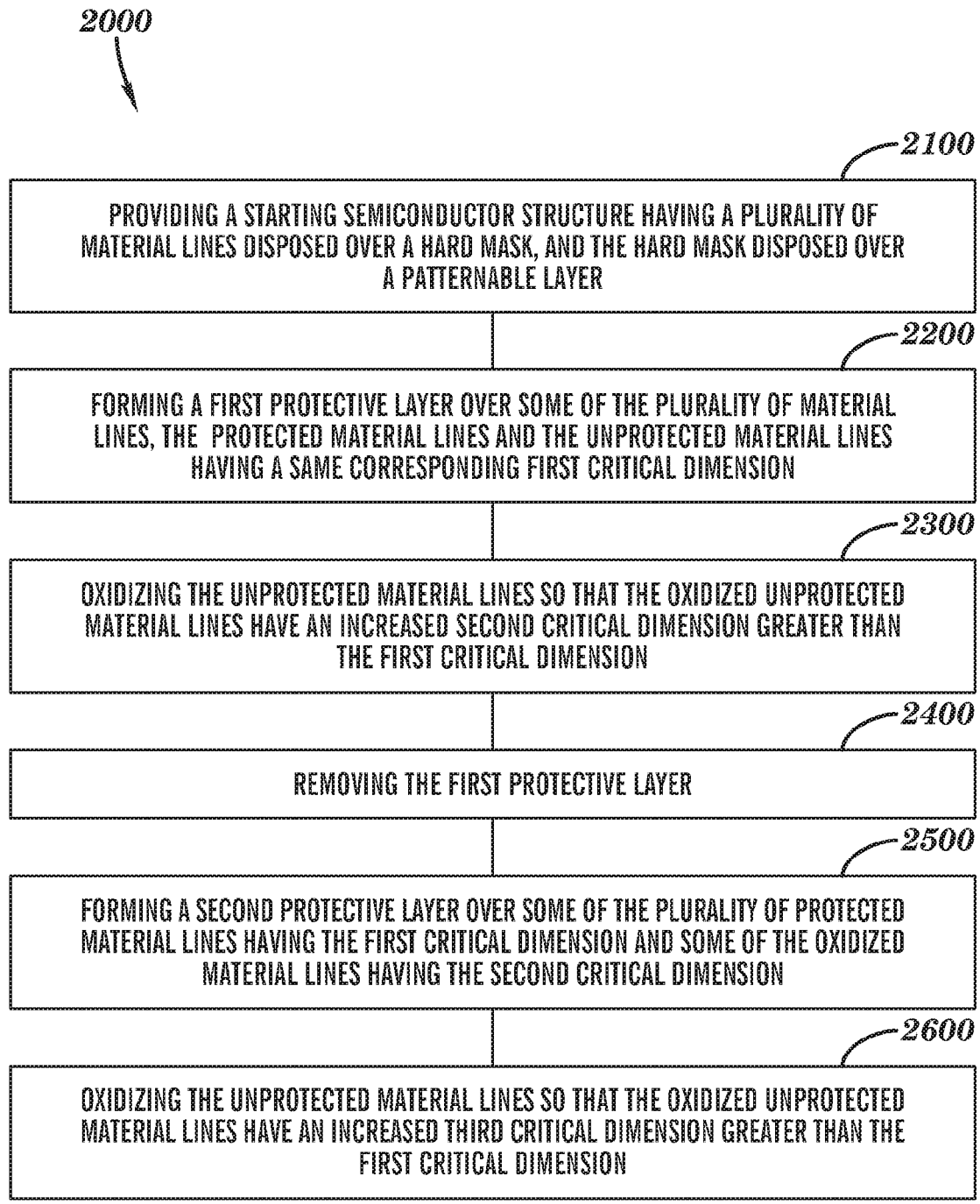
FIG. 18 is a flowchart illustrating a method according to an embodiment of the present disclosure.

FIG. 18 is a flowchart of a method 2000 according to an embodiment of the present disclosure. Method 2000 includes, for example, at 2100 providing a starting semiconductor structure having a plurality of material lines disposed over a hard mask, and the hard mask disposed over a patternable layer, at 2200 forming a first protective layer over some of the plurality of material lines, the protected material lines and the unprotected material lines having a same corresponding first critical dimension, at 2300 oxidizing the unprotected material lines so that the oxidized unprotected material lines have an increased second critical dimension greater than the first critical dimension, at 2400 removing the first protective layer, at 2500 forming a second protective layer over some of the plurality of protected material lines having the first critical dimension and some of the oxidized material lines having the second critical dimension, and at 2600 oxidizing the unprotected material lines so that the oxidized unprotected material lines have an increased third critical dimension greater than the first critical dimension.

Figure 19:
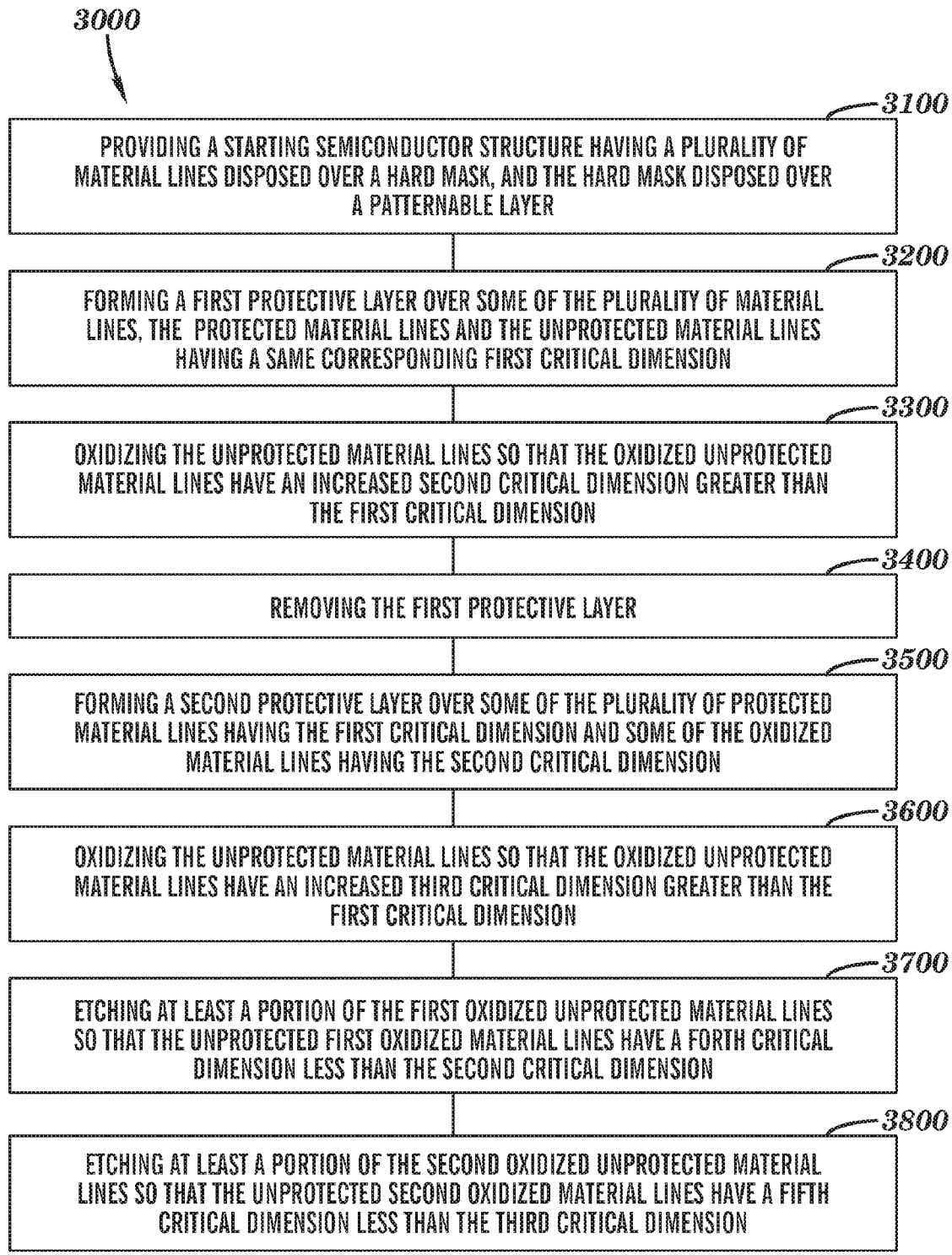
FIG. 19 is a flowchart illustrating a method according to an embodiment of the present disclosure.

FIG. 19 is a flowchart of a method 3000 according to an embodiment of the present disclosure. Method 3000 includes, for example, at 3100 providing a starting semiconductor structure having a plurality of material lines disposed over a hard mask, and the hard mask disposed over a patternable layer, at 3200 forming a first protective layer over some of the plurality of material lines, the protected material lines and the unprotected material lines having a same corresponding first critical dimension, at 3300 oxidizing the unprotected material lines so that the oxidized unprotected material lines have an increased second critical dimension greater than the first critical dimension, at 3400 removing the first protective layer, at 3500 forming a second protective layer over some of the plurality of protected material lines having the first critical dimension and some of the oxidized material lines having the second critical dimension, at 3600 oxidizing the unprotected material lines so that the oxidized unprotected material lines have an increased third critical dimension greater than the first critical dimension, at 3700 etching at least a portion of the first oxidized unprotected material lines so that the unprotected first oxidized material lines have a forth critical dimension less than the second critical dimension, and at 3800 etching at least a portion of the second oxidized unprotected material lines so that the unprotected second oxidized material lines have a fifth critical dimension less than the third critical dimension.

Another method according to an embodiment of the present disclosure includes providing a starting semiconductor structure, the starting semiconductor structure having a material layer, a hard mask layer over the material layer, and a plurality of material lines over the hard mask layer, forming a protective layer over one or more, but less than all of the plurality of material lines, wherein at least one protected material line and at least one unprotected material line have a same critical dimension, and after forming the protective layer, fully oxidizing unprotected material lines, wherein the fully oxidized at least one unprotected material line has a larger critical dimension than the at least one protected material line. For example, the structure in FIG. 4 may be used forming hard mask lines having different critical dimensions.

It will be appreciated from the present disclosure provides a new SADP method or SAQP method with selective multi-CD patterning capability (e.g., 1 extra mask for 2 CDs at the same pitch, 2 masking steps for 4 CDs at same pitch, etc.) by selectively fine tuning the spacer CD using oxidation or partial oxidation and wet/dry oxide etching. Then proceed with the rest of conventional SADP or SAQP steps by etching down and transfer pattern on under-layers (e.g. HM, Si, a-Si, oxide, etc). The present method can be used for forming fins with selective fin-width for multi-Vt scheme. The present method can also be used for forming multiple channel length without using critical multiple gate litho/etch steps.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of one or more aspects of the present disclosure and the practical application, and to enable others of ordinary skill in the art to understand one or more aspects of the disclosure for various embodiments with various modifications as are suited to the particular use contemplated.

The invention claimed is:

1. A method comprising:
   providing a starting semiconductor structure comprising a plurality of material lines disposed over a hard mask, and the hard mask disposed over a patternable layer;
   forming a first protective layer over some of the plurality of material lines, the protected material lines and the unprotected material lines having a same corresponding first critical dimension;
   oxidizing the unprotected material lines so that the oxidized unprotected material lines have an increased second critical dimension greater than the first critical dimension;
   removing the first protective layer;
   forming a second protective layer over some of the plurality of protected material lines having the first critical dimension and some of the oxidized material lines having the second critical dimension; and oxidizing the unprotected material lines so that the oxidized unprotected material lines have an increased third critical dimension greater than the first critical dimension.

2. The method of claim 1 wherein third critical dimension is greater than the second critical dimension.

3. The method of claim 1 wherein third critical dimension is less than the second critical dimension.

4. The method of claim 1 wherein the first oxidizing comprising fully oxidizing the unprotected material lines.

5. The method of claim 1 wherein the first oxidizing comprising partially oxidizing the unprotected material lines.

6. The method of claim 1 wherein the second oxidizing comprising fully oxidizing at unprotected material lines.

7. The method of claim 1 wherein the second oxidizing comprising partially oxidizing at unprotected material lines.

8. The method of claim 1 further comprising:
etching at least a portion of the first oxidized unprotected material lines so that the unprotected first oxidized material lines have a forth critical dimension less than the second critical dimension, and
etching at least a portion of the second oxidized unprotected material lines so that the unprotected second oxidized material lines have a fifth critical dimension less than the third critical dimension.

9. The method of claim 8 wherein the first oxidizing comprising fully oxidizing the unprotected material lines.

10. The method of claim 8 wherein the first oxidizing comprising partially oxidizing the unprotected material lines.

11. The method of claim 8 wherein the second oxidizing comprising fully oxidizing at unprotected material lines.

12. The method of claim 8 wherein the second oxidizing comprising partially oxidizing at unprotected material lines.

13. The method of claim 8 further comprising:
removing the protective layer;
forming a patterned hard mask layer from the hard mask layer using at least one protected material line and the at least one etched material line; and
wherein the patterned hard mask layer comprises material lines having the different critical dimensions.

14. The method of claim 13 further comprising:
forming a patterned layer from the patternable layer using the patterned hard mask layer; and
wherein the patterned layer comprise material lines having the different critical dimensions.

15. The method of claim 14 wherein the starting semiconductor structure is situated over a bulk semiconductor substrate, and further comprising using to the patterned layer having the different critical dimensions to form finFETS, dummy gates, back end of line (BEOF) features, or front end of line (FEOL) features.

* * * * *